United States Patent
Ho et al.

(10) Patent No.: US 11,153,982 B2
(45) Date of Patent: Oct. 19, 2021

(54) ROLLABLE STRUCTURE AND ELECTRONIC DEVICE USING SAME

(71) Applicant: PEGATRON CORPORATION, Taipei (TW)

(72) Inventors: Ming-Hua Ho, Taipei (TW); Yu-Wei Lin, Taipei (TW); Po-Tsung Shih, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/869,705

(22) Filed: May 8, 2020

(65) Prior Publication Data

US 2020/0413555 A1    Dec. 31, 2020

(30) Foreign Application Priority Data

Jun. 25, 2019   (TW) ................................. 108122229

(51) Int. Cl.
| | |
|---|---|
| *H05K 7/02* | (2006.01) |
| *H05K 7/04* | (2006.01) |
| *H05K 5/02* | (2006.01) |
| *H05K 5/00* | (2006.01) |

(52) U.S. Cl.
CPC ......... *H05K 5/0217* (2013.01); *H05K 5/0017* (2013.01)

(58) Field of Classification Search
USPC ........................................................ 361/807
See application file for complete search history.

(56) References Cited

U.S. PATENT DOCUMENTS

| | | | | |
|---|---|---|---|---|
| 2,200,142 | A * | 5/1940 | Witschi ..................... | E05D 3/16 16/369 |
| 4,611,710 | A * | 9/1986 | Mitsufuji ............... | B65G 17/08 198/853 |
| 10,129,991 | B2 | 11/2018 | Lin et al. | |
| 10,209,743 | B1 | 2/2019 | Hsu et al. | |
| 2014/0196254 | A1* | 7/2014 | Song ......................... | E05D 3/14 16/302 |
| 2017/0027067 | A1* | 1/2017 | Choi ..................... | G06F 1/1652 |

FOREIGN PATENT DOCUMENTS

| | | |
|---|---|---|
| TW | M302427 U | 12/2006 |
| TW | 201820296 A | 6/2018 |
| TW | M563489 U | 7/2018 |

* cited by examiner

*Primary Examiner* — Hung S. Bui
(74) *Attorney, Agent, or Firm* — McClure, Qualey & Rodack, LLP

(57) ABSTRACT

A rollable structure includes an outer and an inner sliding rail. The outer sliding rail includes outer sliding blocks and outer shafts. Each of the outer shafts is fixed between any two adjacent outer sliding blocks. The inner sliding rail is movably clamped in the outer sliding rail and includes inner sliding blocks and inner shafts. Each of the inner shafts is fixed between any two adjacent inner sliding blocks. When axes of the outer shafts are aligned with axes of the inner shafts, the outer sliding blocks can rotate with the outer shafts as axes, and the inner sliding blocks can rotate with the inner shafts as axes. After the inner and the outer sliding rail move relative to each other, the axes of the inner and the outer shafts are misaligned, so that the outer and the inner sliding rail are in a plane.

20 Claims, 6 Drawing Sheets

ROLLABLE STRUCTURE AND ELECTRONIC DEVICE USING SAME

CROSS-REFERENCE TO RELATED APPLICATION

This application claims the priority benefit of Taiwan application serial no. 108122229, filed on Jun. 25, 2019. The entirety of the above-mentioned patent application is hereby incorporated by reference herein and made a part of this specification.

BACKGROUND

Technical Field

The present disclosure relates to a rollable structure and an electronic device using the same, and in particular, to a rollable structure that may be used to roll up or pull out and fix a display screen and an electronic device using the same.

Related Art

In an existing design, a screen display area of a small-sized mobile device is increased by connecting screens in parallel by using a plurality of devices, but the parallel connection manner results in seams among the screens. There is also a way of expanding a screen, but inconvenience in portability is caused. In addition, if a size of the mobile device is increased in the foregoing manners, an original intention of providing convenience in portability is lost.

Currently, there are products using a flexible screen, which has an advantage of making small-sized mobile devices have an expanded operation visual field. However, there are no products for effectively protecting related structures of the flexible screen. Even though the screen itself has light, thin, and flexible features, there is a problem in rolling, and the screen is prone to be rolled or be damaged by an external force when the screen is used as an independent product without a protection structure.

SUMMARY

Both portability and visual enjoyment are mostly pursued on existing mobile devices. Therefore, a display area as large as possible needs to be provided at a volume of an electronic device as small as possible, so that a user can enjoy experience of a broader vision on a small-sized mobile device.

In view of this, in an embodiment of the present disclosure, a rollable structure is provided, including an outer sliding rail and an inner sliding rail. The outer sliding rail includes a plurality of outer sliding blocks and a plurality of outer shafts, where the outer sliding blocks is disposed adjacently, and each of the outer shafts is fixed between any two adjacent outer sliding blocks. The inner sliding rail is movably clamped in the outer sliding rail and includes a plurality of inner sliding blocks and a plurality of inner shafts. The inner sliding blocks is disposed adjacently, and each of the inner shafts is fixed between any two adjacent inner sliding blocks. When axes of the outer shafts are aligned with axes of the inner shafts, the outer sliding blocks are capable of rotating and bending by using the outer shafts as axes, and the inner sliding blocks are capable of rotating and bending by using the inner shafts as axes. After the inner sliding rail and the outer sliding rail move relative to each other, the axes of the inner shafts and the axes of the outer shafts are misaligned, and the inner sliding blocks are respectively located at positions of the axes of the outer shafts, so that the outer sliding rail and the inner sliding rail are in a plane.

In another embodiment of the present disclosure, an electronic device is provided, including a housing, a coil spring, a rollable structure, and a flexible screen. The coil spring is disposed in the housing. An outer sliding rail and an inner sliding rail of the rollable structure are selectively accommodated in or stretched out from the housing, and one of the plurality of outer sliding blocks of the outer sliding rail is connected to the coil spring. The flexible screen is disposed in close contact with one side of the outer sliding rail.

In this manner, by using the inner sliding rail and the outer sliding rail that are capable of sliding relative to each other, the rollable structure may be bent and rolled, or straightened and positioned. When the axes of the outer shafts of the outer sliding rail are aligned with the axes of the inner shafts of the inner sliding rail, the rollable structure can be bent to form a rolled state. When the outer sliding rail and the inner sliding rail are stretched, until the inner sliding rail and the outer sliding rail move relative to each other, because the axes of the outer shafts of the outer sliding rail and the axes of the inner shafts of the inner sliding rail are misaligned and the inner sliding blocks move to positions of the axes of the outer shafts, the outer sliding rail and the inner sliding rail are straightened and positioned to form a plane.

In this way, when the rollable structure is applied to the electronic device, the flexible screen may be disposed in close contact with the outer sliding rail, and the rollable structure is used together with the structure of the coil spring. For example, when the flexible screen is not used, the rollable structure is pulled into the housing by using the elasticity of the coil spring. In this case, the rollable structure is in a bendable state, and therefore may be rolled, bent and stored in the housing. When the flexible screen is to be used, a force is applied to the outer sliding rail and the inner sliding rail to pull out the outer sliding rail and the inner sliding rail to drive the flexible screen to be pulled out. The force continues to be applied until the inner sliding rail and the outer sliding rail are staggered in relative movement and then the outer sliding rail and the inner sliding rail are straightened and positioned to form a plane. In this case, even though the coil spring provides a restoring force, the rollable structure cannot be rolled up and stored in the housing, so that the flexible screen may be pulled out and positioned outside the housing, and a user may view or operate the flexible screen.

Because the flexible screen may be rolled, bent and stored in the housing by using the rollable structure when not in use, the whole volume becomes as small as possible through rolling, bending and storage when the flexible screen is in a stored state, and a needed length of the flexible screen may also be shrunk as far as possible. When the flexible screen is to be used, the flexible screen may be pulled out and positioned by using the rollable structure, so that the flexible screen may be provided with a stabilization and positioning structure, to prevent the flexible screen from being prone to be rolled or be damaged by an external force during viewing and operating. Therefore, a display area as large as possible may be provided at a volume of the electronic device as small as possible, so that the user can enjoy experience of a broader vision on a small-sized mobile device.

Detailed features and advantages of the present disclosure are described below in detail in embodiments. Content of the detailed features and advantages sufficiently enables any person skilled in the art to learn about technical content of the present disclosure and perform implementation according to the technical content. In addition, any person skilled in the art can easily understand objectives and advantages related to the present disclosure according to content disclosed in the specification, claims and drawings.

DETAILED DESCRIPTION

Figure 1:
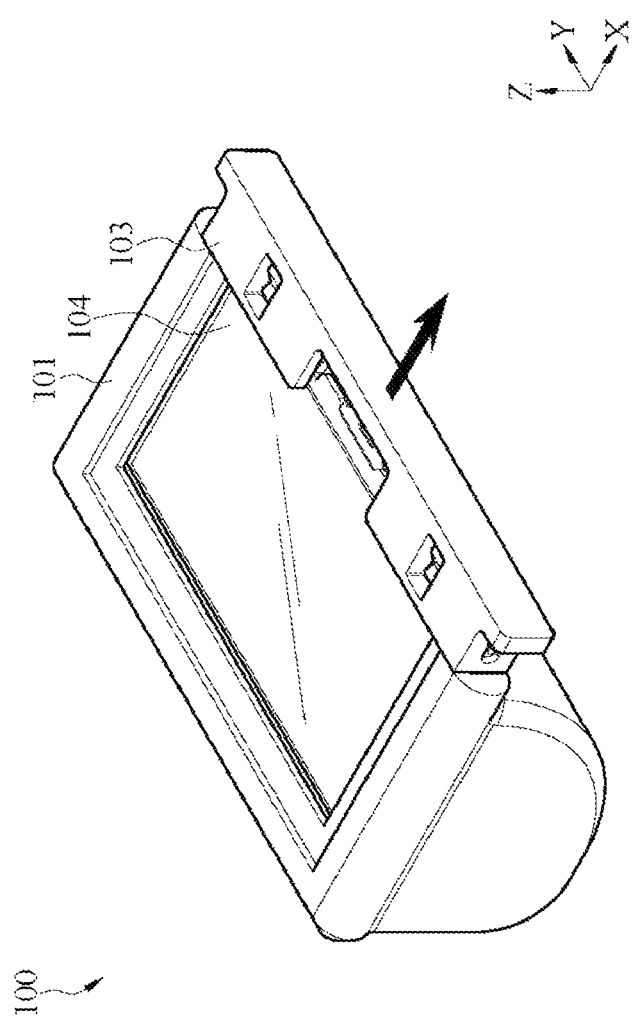
FIG. 1 is a three-dimensional view of an electronic device according to an embodiment of the present disclosure.
Figure 2:
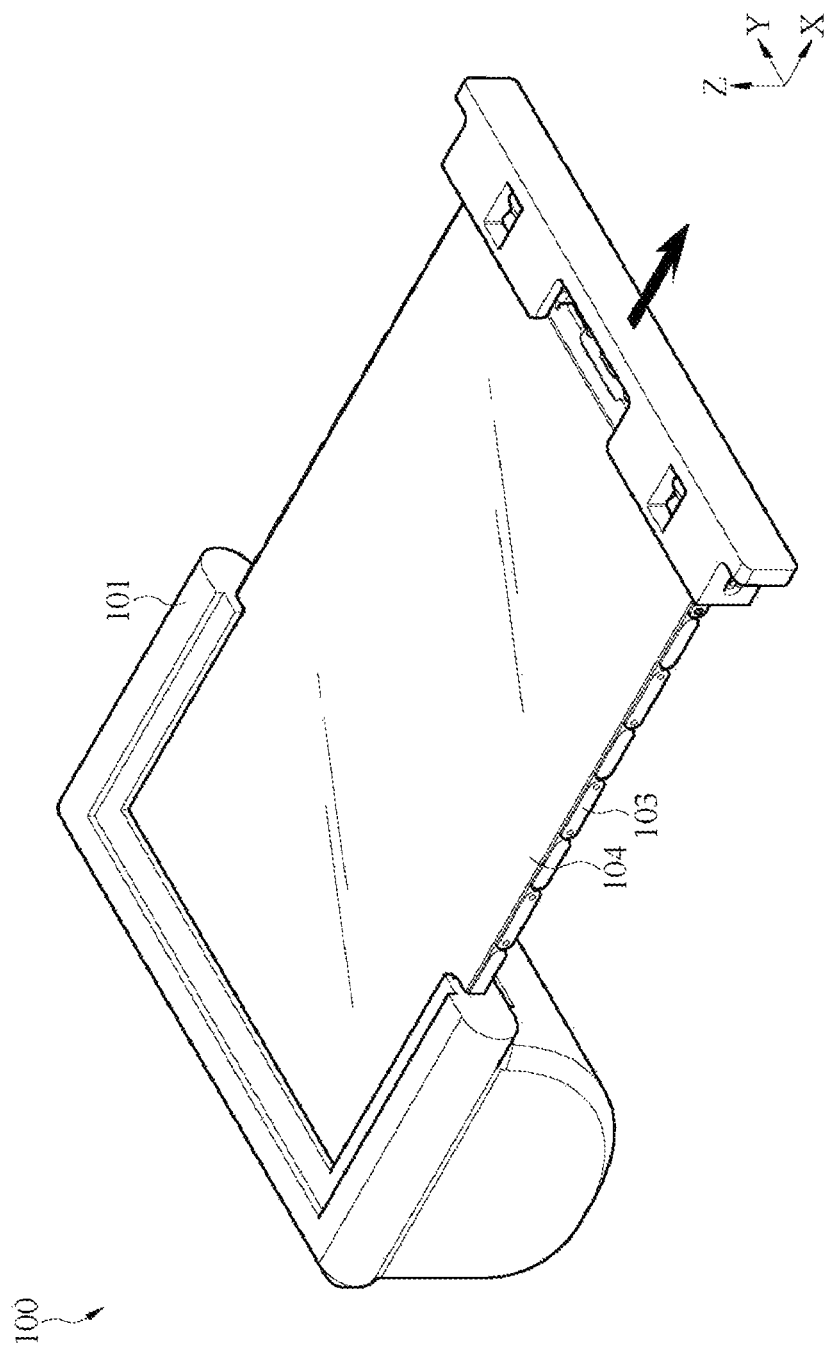
FIG. 2 is a three-dimensional view of pulling out a rollable structure of an electronic device according to an embodiment of the present disclosure.

Refer to FIG. 1 and FIG. 2 first. FIG. 1 is a three-dimensional view of an electronic device according to an embodiment of the present disclosure. FIG. 2 is a three-dimensional view of pulling out a rollable structure of an electronic device according to an embodiment of the present disclosure. The electronic device 100 in this embodiment may be a small-sized mobile device such as a mobile phone or a tablet computer, or may be large-sized display screen or the like. The present disclosure is not limited thereto.

The electronic device 100 includes a housing 101, a coil spring (not shown), a rollable structure 103, and a flexible screen 104. The coil spring is disposed in the housing 101. The rollable structure 103 may be selectively accommodated in or stretched out from the housing 101. The flexible screen 104 is disposed in close contact with the rollable structure 103. In this embodiment, the coil spring is omitted and is not shown, but it should be learned that a pulling force of the rollable structure 103 may be provided by using an elasticity mechanism of the coil spring, so that the rollable structure 103 in a rotatable state may be rolled up and stored into the housing 101.

In this manner, by using the rollable structure 103 that may be bent and rolled or straightened and positioned, when the flexible screen 104 is not in use, the rollable structure 103 is pulled into the housing 101 by using the elasticity of the coil spring. In this case, the rollable structure 103 is in a bendable state, and therefore may be rolled, bent and stored in the housing 101. When the flexible screen 104 is to be used, a force may be applied to the rollable structure 103 to drive the flexible screen 104 to be pulled out. The force continues to be applied until the rollable structure 103 is straightened and positioned to form a plane and is not bent. In this case, even though the coil spring provides a restoring force, the rollable structure 103 cannot be rolled up and stored into the housing 101, so that the flexible screen 104 may be pulled out and positioned outside the housing 101, and a user may view or operate the flexible screen 104.

Because the flexible screen 104 may be rolled, bent and stored in the housing 101 by using the rollable structure 103 when not in use, the whole volume becomes as small as possible through rolling, bending and storage when the flexible screen 104 is in a stored state, and a needed length of the flexible screen 104 may also be shrunk as far as possible. When the flexible screen 104 is to be used, the flexible screen 104 is pulled out and positioned by using the rollable structure 103, to prevent the flexible screen 104 from being prone to be rolled or be damaged by an external force during viewing and operating. Therefore, a display area as large as possible may be provided at a volume of the electronic device as small as possible, so that the user can enjoy experience of a broader vision on a small-sized mobile device.

Figure 3:
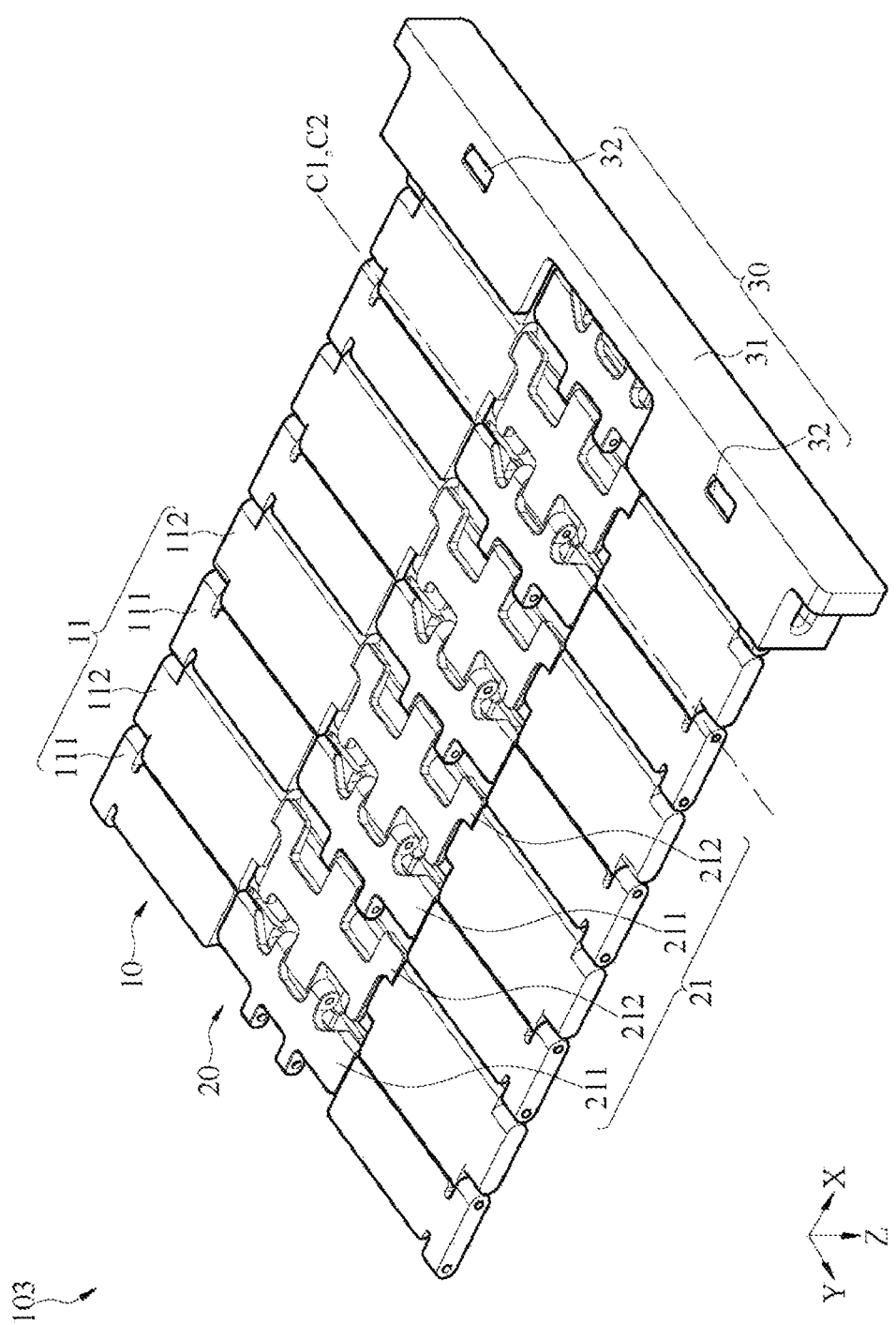
FIG. 3 is a three-dimensional view of a rollable structure according to an embodiment of the present disclosure.
Figure 4:
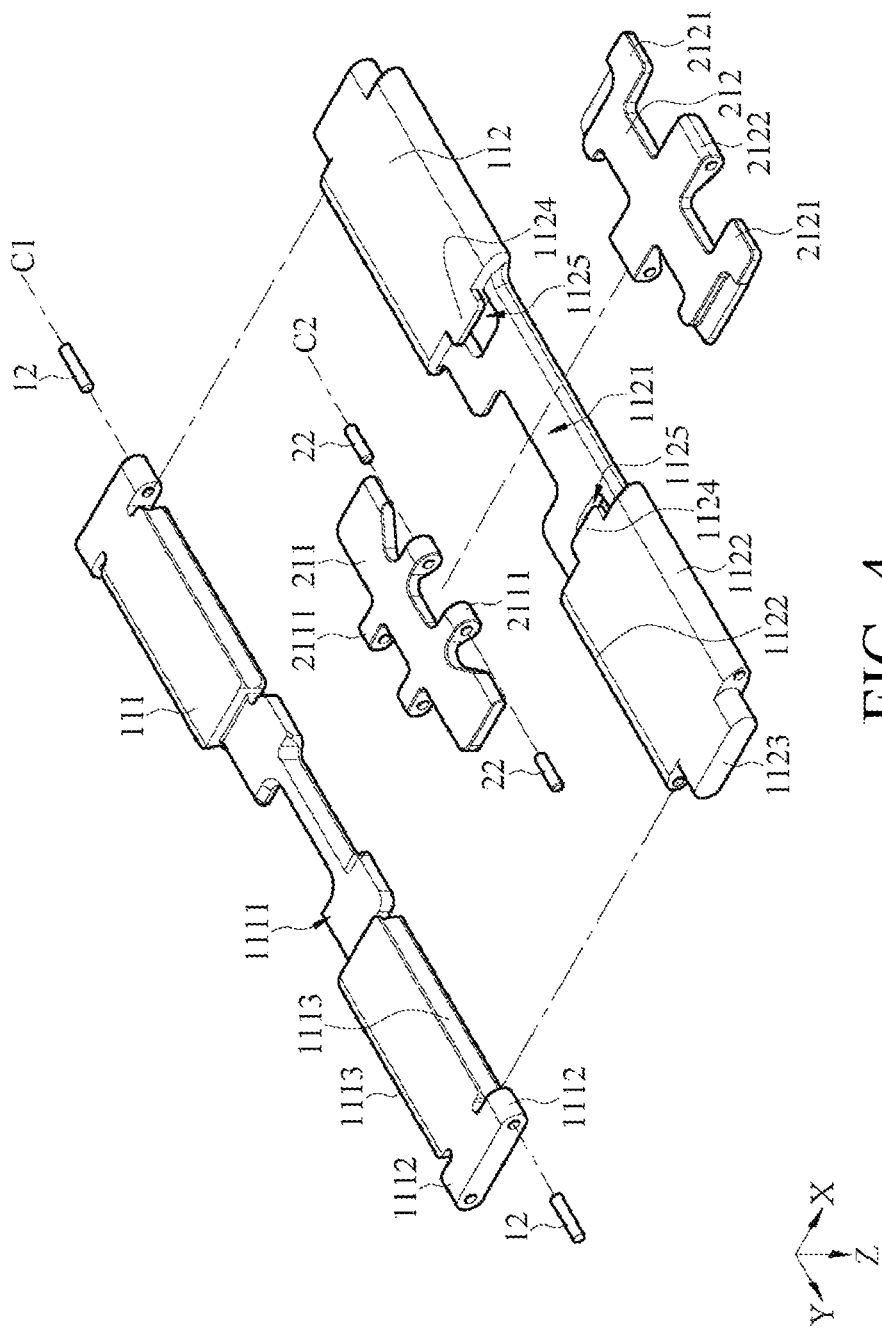
FIG. 4 is a partial exploded view of a rollable structure according to an embodiment of the present disclosure.
Figure 5:
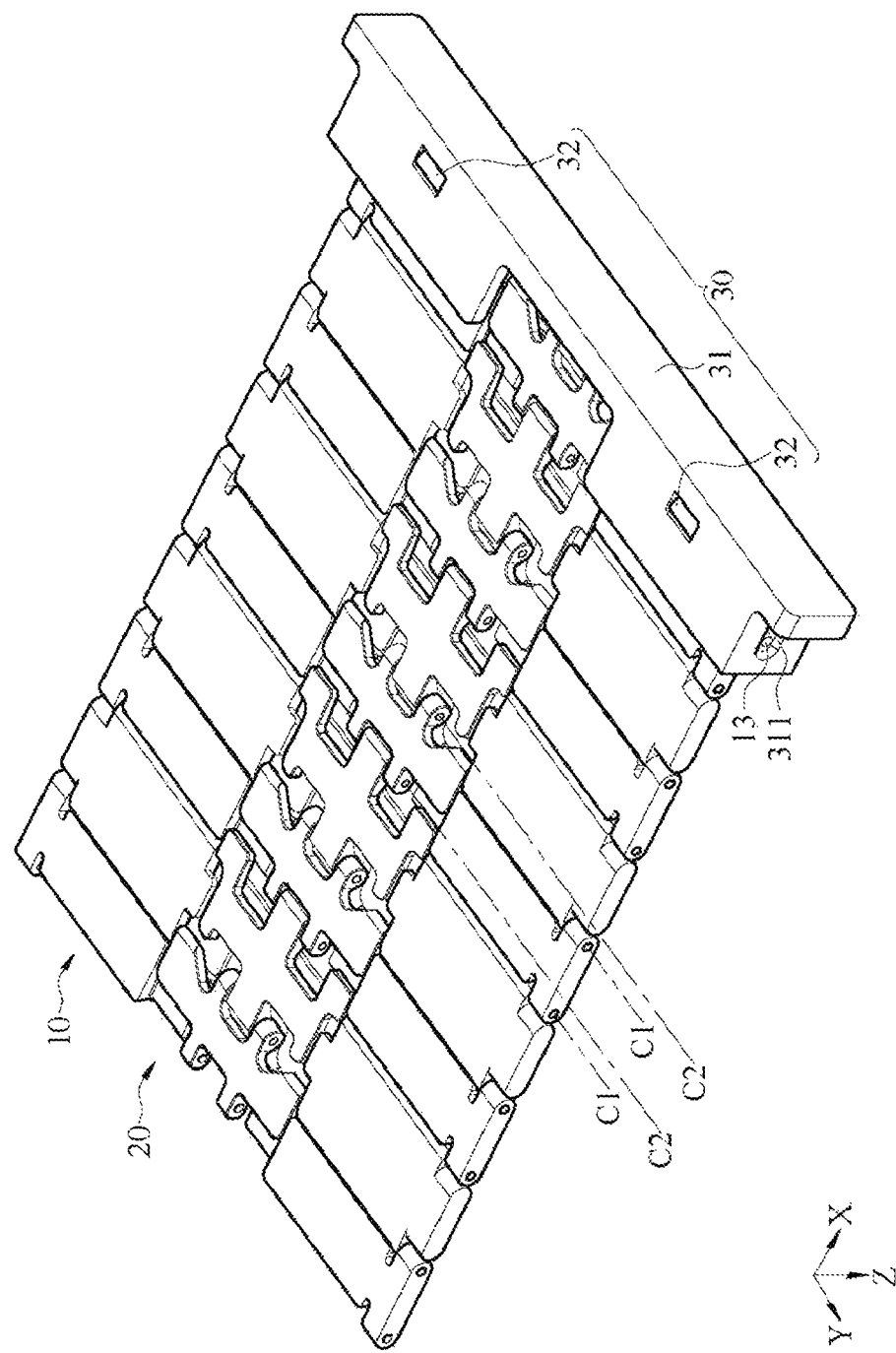
FIG. 5 is a schematic view of actuation of a rollable structure according to an embodiment of the present disclosure.
Figure 6:
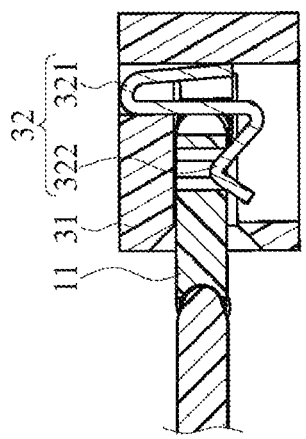
FIG. 6 is a partial cross-sectional view of a rollable structure in a state of FIG. 3 according to an embodiment of the present disclosure.
Figure 7:
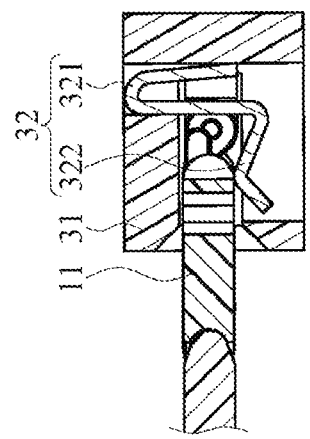
FIG. 7 is a partial cross-sectional view of a rollable structure in a state of FIG. 5 according to an embodiment of the present disclosure.

The following will describe a detail structure and an actuation principle of the rollable structure 103 in detail. First, for ease of subsequent description, as shown in FIG. 1 and FIG. 2, a direction (a first direction) in which the rollable structure 103 in the electronic device 100 is pulled out is set as an X-axis direction, a direction perpendicular to the X-axis and parallel to the flexible screen 104 is set as a Y-axis direction, and a direction perpendicular to the X-axis and the Y-axis is set as a Z-axis direction. Subsequently, refer to FIG. 3 to FIG. 7. FIG. 3 is a three-dimensional view of a rollable structure according to an embodiment of the present disclosure; FIG. 4 is a partial exploded view of a rollable structure according to an embodiment of the present disclosure; FIG. 5 is a schematic view of actuation of a rollable structure according to an embodiment of the present disclosure; FIG. 6 is a partial cross-sectional view of a rollable structure in a state of FIG. 3 according to an embodiment of the present disclosure; and FIG. 7 is a partial cross-sectional view of a rollable structure in a state of FIG. 5 according to an embodiment of the present disclosure.

In this embodiment, it may be seen from FIG. 3 and FIG. 4 that, the rollable structure 103 includes an outer sliding rail 10, an inner sliding rail 20, and a holding portion 30. The outer sliding rail 10 includes a plurality of outer sliding blocks 11 and a plurality of outer shafts 12. The outer sliding blocks 11 are disposed adjacently, and each of the outer shafts 12 is fixed between any adjacent two of the outer sliding blocks 11. In this way, the adjacent two outer sliding blocks 11 may rotate relative to each other by using the outer shaft 12 as an axis. The inner sliding rail 20 is movably clamped in the outer sliding rail 10. The inner sliding rail 20 includes a plurality of inner sliding blocks 21 and a plurality of inner shafts 22. The inner sliding blocks 21 are disposed adjacently, and each of the inner shafts 22 is fixed between any adjacent two of the inner sliding blocks 21. In this way, the adjacent two inner sliding blocks 21 may rotate relative to each other by using the inner shaft 22 as an axis.

As shown in FIG. 3, when axes C1 of the outer shafts 12 are aligned with axes C2 of the inner shafts 22 (indicating that the axes C1 and the axes C2 are located on a same axial line), the outer sliding blocks 11 are capable of rotating and bending relative to each other by using the outer shafts 12 as axes, and the inner sliding blocks 21 are capable of rotating and bending relative to each other by using the inner shafts 22 as axes. The outer sliding blocks 11 and the inner sliding blocks 21 are in a bendable state. Therefore, the outer sliding rail 10 and the inner sliding rail 20 may be bent and stored in the housing 101 if a pulling force of the coil spring is applied to the outer sliding rail 10 and the inner sliding rail 20.

Further as shown in FIG. 5, when the outer sliding rail 10 and the inner sliding rail 20 are pulled out under the force, until the inner sliding rail 20 and the outer sliding rail 10 move relative to each other and then the axes C2 of the inner shafts 22 and the axes C1 of the outer shafts 12 are misaligned. The inner sliding blocks 21 respectively move to positions of the axes C1 of the outer shafts 12, so that the outer sliding rail 10 and the inner sliding rail 20 are in a plane. In this case, the outer sliding rail 10 and the inner sliding rail 20 are straightened and positioned to form a plane and cannot be bent. Therefore, even though the coil spring provides a restoring force, the rollable structure 103 cannot be rolled up and stored in the housing 101, so that the rollable structure 103 is positioned in a state shown in FIG. 5.

Subsequently, the following will further describe detail structures and actuation manners of the outer sliding rail 10, the inner sliding rail 20, and the holding portion 30 in detail. It may be seen from FIG. 3 and FIG. 4 that, the outer sliding blocks 11 include a plurality of first outer sliding blocks 111 and a plurality of second outer sliding blocks 112, and the first outer sliding blocks 111 and the second outer sliding blocks 112 are spaced apart from each other and sequentially connected. Each first outer sliding block 111 is provided with a groove 1111, and each second outer sliding block 112 is provided with a groove 1121. The inner sliding blocks 21 are accommodated and slide in the grooves 1111 and 1121. In this embodiment, a length of each of the grooves 1111 and 1121 along a long edge direction should be designed to allow the inner sliding block 21 to be accommodated, and preferably approximately equal to a length of a long edge of the inner sliding block 21, to provide a limiting effect on two end portions of the long edge of the inner sliding block 21. That is, when the inner sliding blocks 21 move relative to the outer sliding blocks 11, the grooves 1111 and 1121 may provide a limiting effect, so that the inner sliding blocks 21 actuate toward only the X-axis direction (the first direction) in which a force is applied to perform stretching, and does not have an offset in the Y-axis direction.

Subsequently, detail structures of the first outer sliding blocks 111 and the second outer sliding blocks 112 are described. Because the first outer sliding blocks 111 are all the same and the second outer sliding blocks 112 are all the same, description is made by using only one first outer sliding block 111 and one second outer sliding block 112 as an example in FIG. 4. It may be seen from FIG. 4 that, two end portions (the two ends in the Y-axis direction) of the first outer sliding block 111 along a long edge are respectively provided with two protrusions 1112 protruding outward along a short edge (the two sides in the X-axis direction), each protrusion 1112 protrudes from the adjacent second outer sliding block 112, and the outer shaft 12 penetrates the protrusion 1112 and the second outer sliding block 112. In this manner, the first outer sliding block 111 and the second outer sliding block 112 may rotate relative to each other around the axis C1 of the outer shaft 12.

A side protruded portion 1123 is provided between the protrusions 1112 connected to the second outer sliding block 112 at the two end portions of the second outer sliding block 112 along the long edge (the two ends in the Y-axis direction). The side protruded portions 1123 may enable a total length of the second outer sliding blocks 112 in the Y-axis direction equal to a total length of the first outer sliding blocks 111 in the Y-axis direction. After assembly is completed, as shown in FIG. 3, the second outer sliding blocks 112 and the first outer sliding blocks 111 are flush along the left side and the right side of the Y-axis when the sliding blocks are seen from an XY plane. The sliding blocks are not staggered and have a beautiful appearance.

Still referring to FIG. 4, each of the long edge sides (the two sides of the long edge in the X-axis direction) of the first outer sliding block 111 is provided with an arc-shaped groove 1113, each of the long edge sides (the two sides of the long edge in the X-axis direction) of the second outer sliding block 112 is provided with an arc-shaped protruded portion 1122, and each arc-shaped protruded portion 1122 of the second outer sliding block 112 is correspondingly accommodated in the arc-shaped groove 1113 of the neighboring first outer sliding block 111. In this manner, by using mutual positioning between the arc-shaped protruded portions 1122 and the arc-shaped grooves 1113, the first outer sliding blocks 111 and the second outer sliding blocks 112 may rotate more stably around the axes C1. Furthermore, when rotating relative to each other, the arc-shaped protruded portions 1122 and the arc-shaped grooves 1113 may rotate more smoothly.

Still referring to FIG. 3 and FIG. 4, in this embodiment, the inner sliding blocks 21 include a plurality of first inner sliding blocks 211 and a plurality of second inner sliding blocks 212. The first inner sliding blocks 211 and the second inner sliding blocks 212 are spaced apart from each other and sequentially connected. The first inner sliding blocks 211 are disposed corresponding to the first outer sliding blocks 111, and the first inner sliding blocks 211 are disposed slidably in the grooves 1111 of the first outer sliding blocks 111. The second inner sliding blocks 212 are disposed corresponding to the second outer sliding blocks 112, and the second inner sliding blocks 212 are disposed slidably in the grooves 1121 of the second outer sliding blocks 112.

It may be seen from FIG. 4 that, each second outer sliding block 112 includes two stop protruded portions 1124 extending toward the groove 1121, two sliding slots 1125 are formed in the groove 1121, and the second inner sliding block 212 penetrates the two sliding slots 1125 of the corresponding second outer sliding block 112. In this manner, the second outer sliding block 112 moves in the sliding slots 1125 along the X-axis direction, and the second outer sliding block 112 is stopped in the Z-axis direction by using the stop protruded portion 1124, to avoid movement in the Z-axis direction.

Furthermore, each second inner sliding block 212 is provided with two limiting portions 2121, and the limiting portions 2121 stop against the stop protruded portions 1124 in a direction in which the first inner sliding blocks 211 and the second inner sliding blocks 212 are sequentially connected (that is, the X-axis direction shown in FIG. 4). When the inner sliding rail 20 is to return from the stretching and positioning state shown in FIG. 5 to the bendable state shown in FIG. 3 with a force applied in an opposite direction, the outer sliding rail 10 and the inner sliding rail 20 move relative to each other in the X-axis direction, and then the inner sliding rail 20 may stop, with the mutual limiting of the limiting portions 2121 and the stop protruded portions 1124, against a position at which the axes C2 of the inner shafts 22 are aligned with the axes C1 of the outer shafts 12.

In addition, two parallel first pivoting portions 2111 are provided to protrude (protrude along the X-axis direction) from a long edge side of each first inner sliding block 211, and one second pivoting portion 2122 is provided to protrudes (protrudes along the X-axis direction) from a long edge side of each second inner sliding block 212. The second pivoting portion 2122 of each second inner sliding block 212 is correspondingly disposed between the two first pivoting portions 2111 of two adjacent first inner sliding blocks 211, and the inner shafts 22 penetrate the first pivoting portions 2111 and the second pivoting portion 2122. In this manner, the first inner sliding blocks 211 and the second inner sliding blocks 212 may rotate relative to each other around the axes C2 of the inner shafts 22. In some implementations, the inner shaft 22 may alternatively pass through the two first pivoting portions 2111 and the second pivoting portion 2122. In this case, it is not required to connect the first pivoting portions 2111 and the second pivoting portion 2122 respectively from the left edge and the right edge by using two inner shafts 22.

Next, referring to FIG. 3, FIG. 6, and FIG. 7, the holding portion 30 includes a grip 31 and a clamping member 32. The grip 31 is connected to one inner sliding block 21 of the inner sliding rail 20, in which the inner sliding block 21 may be the first inner sliding block 211 or the second inner sliding block 212. The clamping member 32 is disposed in the grip 31, and the clamping member 32 is connected to one outer sliding block 11 of the outer sliding rail 10. Similarly, the outer sliding block 11 connected to the clamping member 32 may be the first outer sliding block 111 or the second outer sliding block 112.

It may be seen from FIG. 6 and FIG. 7 that, there may be two clamping members 32, and the clamping members 32 may be implemented by elastic elements. The clamping member 32 includes a fixing portion 321 and a hook portion 322, in which the fixing portion 321 is fixedly disposed at the grip 31, and the hook portion 322 is connected to the fixing portion 321. The hook portion 322 selectively hooks on the outer sliding block 11 (as shown in FIG. 6) or abuts against the outer sliding block 11 (as shown in FIG. 7). When the rollable structure 103 is stored in the housing 101 (as shown in FIG. 1), or the outer sliding rail 10 and the inner sliding rail 20 are stretched out from the housing 101 by pulling the grip 31 to apply a force outward, and the outer sliding rail 10 and the inner sliding rail 20 have not moved relative to each other to be misaligned (as shown in FIG. 3), the hook portion 322 continuously hooks on the outer sliding block 11, so that the outer sliding block 11 may be driven to stretch. After the outer sliding rail 10 and the inner sliding rail 20 are pulled out to a defined length, the outer sliding rail 10 cannot be further pulled out. In this case, when a force is continuously applied to the grip 31, the hook portion 322 releases hooking of the outer sliding block 11 under the effect of elasticity, and abuts against a side surface of the outer sliding block 11. In this case, the outer sliding rail 10 is stopped from being stretched, and the inner sliding rail 20 is continuously subjected to an outward pulling force applied to the grip 31, so that the inner sliding rail 20 and the outer sliding rail 10 move relative to each other (as shown in FIG. 5).

When the rollable structure 103 is to be bended from the stretching and positioning state shown in FIG. 5, a force is applied in a direction from the grip 31 to the housing 101 along the X-axis, so that the grip 31 is pushed to the outer sliding block 11, the hook portion 322 hooks on the outer sliding block 11 again (that is, returns to a state shown in FIG. 6) under the effect of elasticity, and the inner sliding rail 20 is also pushed to a position at which the axis C2 of the inner shaft 22 is aligned with the axis C1 of the outer shaft 12 (as shown in FIG. 3). Because the outer sliding rail 10 and the inner sliding rail 20 may rotate and bend in this case, the outer sliding rail 10 and the inner sliding rail 20 may be rolled up into the housing 101 under the restoring force of the coil spring.

In addition, it may be seen from FIG. 5 that, the grip 31 is provided with a stop groove 311 extending in the first direction (the X-axis direction), the outer sliding block 11 connected to the grip 31 is provided with a limiting post 13, and the limiting post 13 is slidably disposed in the stop groove 311 correspondingly. In this manner, when the outer sliding rail 10 is stopped from being stretched and the grip 31 continuously drives the inner sliding rail 20 to move, the inner sliding rail 20 may move by only a specific distance under the mutual limiting of the stop groove 311 and the limiting post 13, to prevent the inner sliding rail 20 from being excessively stretched.

By using the foregoing structure, because the flexible screen 104 may be rolled, bent and stored in the housing 101 by using the rollable structure 103 when not in use, the whole volume becomes as small as possible through rolling, bending and storage when the flexible screen 104 is in a stored state, and a needed length of the flexible screen 104 may also be shrunk as far as possible. When the flexible screen 104 is to be used, the flexible screen 104 may be pulled out and positioned by using the rollable structure 103, so that the flexible screen 104 may be provided with a stabilization and positioning structure, to prevent the flexible screen 104 from being prone to be rolled or be damaged by an external force during viewing and operating. Therefore, a display area as large as possible may be provided at a volume of the electronic device as small as possible, so that the user can enjoy experience of a broader vision on a small-sized mobile device.

Although the present disclosure has been disclosed by using the foregoing embodiments, the foregoing embodiments are not intended to limit the present disclosure. Any person skilled in the art may make some modifications and improvements without departing from the spirit and the scope of the present disclosure. Therefore, the patent protection scope of the present disclosure is subject to the claims appended in the specification.

What is claimed is:

1. A rollable structure, comprising:
   an outer sliding rail, comprising a plurality of outer sliding blocks and a plurality of outer shafts, wherein the outer sliding blocks are disposed adjacently, and each of the outer shafts is fixed between any adjacent two of the outer sliding blocks; and
   an inner sliding rail, movably clamped in the outer sliding rail and comprising a plurality of inner sliding blocks and a plurality of inner shafts, wherein the inner sliding blocks are disposed adjacently, and each of the inner shafts is fixed between any adjacent two of the inner sliding blocks, and
   wherein when axes of the outer shafts are aligned with axes of the inner shafts, the outer sliding blocks are capable of rotating and bending relative to each other by using the outer shafts as axes, and the inner sliding blocks are capable of rotating and bending relative to each other by using the inner shafts as axes; and
   after the inner sliding rail and the outer sliding rail move relative to each other in opposite directions, the axes of the inner shafts and the axes of the outer shafts are misaligned, and the inner sliding blocks are respectively located at positions of the axes of the outer shafts, so that the outer sliding rail and the inner sliding rail are in a plane.

2. The rollable structure according to claim 1, wherein each of the outer sliding blocks comprises a groove, and the inner sliding blocks are accommodated and slidably disposed in the grooves.

3. The rollable structure according to claim 1, wherein the outer sliding blocks comprise a plurality of first outer sliding blocks and a plurality of second outer sliding blocks, and the first outer sliding blocks and the second outer sliding blocks are spaced apart from each other and sequentially connected.

4. The rollable structure according to claim 3, wherein two end portions of each of the first outer sliding blocks along a long edge are respectively provided with two protrusions protruding outward along a short edge, each of the protrusions protrudes from an adjacent one of the second outer sliding blocks, and each of the outer shafts penetrates the protrusion and the adjacent one of the second outer sliding blocks.

5. The rollable structure according to claim 3, wherein a long edge side of each of the first outer sliding blocks is provided with an arc-shaped groove, a long edge side of each of the second outer sliding block is provided with an arc-shaped protruded portion, and the arc-shaped protruded portion of one of the second outer sliding blocks is correspondingly accommodated in the arc-shaped groove of an adjacent one of the first outer sliding blocks.

6. The rollable structure according to claim 3, wherein the inner sliding blocks comprise a plurality of first inner sliding blocks and a plurality of second inner sliding blocks, the first inner sliding blocks and the second inner sliding blocks are spaced apart from each other and sequentially connected, the first inner sliding blocks are disposed corresponding to the first outer sliding blocks, and the second inner sliding blocks are disposed corresponding to the second outer sliding blocks.

7. The rollable structure according to claim 6, wherein each of the first outer sliding blocks and each of the second outer sliding blocks are provided with a groove respectively, and the first inner sliding blocks and the second inner sliding blocks are slidably disposed in the grooves.

8. The rollable structure according to claim 7, wherein each second outer sliding block comprises two stop protruded portions extending toward the groove, two sliding slots are formed in the groove, and each of the second inner sliding blocks penetrates the two sliding slots of a corresponding one of the second outer sliding blocks.

9. The rollable structure according to claim 8, wherein each of the second inner sliding blocks is provided with two limiting portions, and each of the two limiting portions stops against a corresponding one of the stop protruded portions in a direction in which the first inner sliding blocks and the second inner sliding blocks are sequentially connected, so that the outer sliding rail and the inner sliding rail move relative to each other and then stop against positions at which the axes of the outer shafts are aligned with the axes of the inner shafts.

10. The rollable structure according to claim 6, wherein two parallel first pivoting portions protrude from a long edge side of each of the first inner sliding blocks, a second pivoting portion protrudes from a long edge side of each of the second inner sliding blocks, the second pivoting portion of each of the second inner sliding blocks is correspondingly disposed between the two first pivoting portions of an adjacent one of the first inner sliding blocks, and the inner shafts penetrate the two first pivoting portions and the second pivoting portion.

11. The rollable structure according to claim 1, further comprising a holding portion, comprising a grip and a clamping member, wherein the clamping member is disposed in the grip, the grip is connected to one of the inner sliding blocks of the inner sliding rail, and the clamping member is connected to one of the outer sliding blocks of the outer sliding rail.

12. The rollable structure according to claim 11, wherein the clamping member comprises a fixing portion and a hook portion, the fixing portion is fixedly disposed at the grip, the hook portion is connected to the fixing portion, and the hook portion selectively hooks the outer sliding block or abuts against the one of the outer sliding blocks.

13. The rollable structure according to claim 11, wherein the rollable structure is stretched, under a force, to a first direction, the grip is provided with a stop groove extending along the first direction, the one of the outer sliding blocks connected to the grip is provided with a limiting post, and the limiting post is slidably disposed in the stop groove correspondingly.

14. An electronic device, comprising:
a housing;
a rollable structure, comprising:
an outer sliding rail, comprising a plurality of outer sliding blocks and a plurality of outer shafts, wherein the outer sliding blocks are disposed adjacently, and each of the outer shafts is fixed between any adjacent two of the outer sliding blocks; and
an inner sliding rail, movably clamped in the outer sliding rail and comprising a plurality of inner sliding blocks and a plurality of inner shafts, wherein the inner sliding blocks are disposed adjacently, and each of the inner shafts is fixed between any adjacent two of the inner sliding blocks,
wherein when axes of the outer shafts are aligned with axes of the inner shafts, the outer sliding blocks are capable of rotating and bending relative to each other by using the outer shafts as axes, and the inner sliding blocks are capable of rotating and bending relative to each other by using the inner shafts as axes,
wherein after the inner sliding rail and the outer sliding rail move relative to each other in opposite directions, the axes of the inner shafts and the axes of the outer shafts are misaligned, and the inner sliding blocks are respectively located at positions of the axes of the outer shafts, so that the outer sliding rail and the inner sliding rail are in a plane, and
wherein the outer sliding rail and the inner sliding rail are selectively accommodated in or are stretched out from the housing; and
a flexible screen, disposed in close contact with one side of the outer sliding rail.

15. The electronic device according to claim 14, wherein each of the outer sliding blocks comprises a groove, and the inner sliding blocks are accommodated and slidably disposed in the grooves.

16. The electronic device according to claim 14, wherein the outer sliding blocks comprise a plurality of first outer sliding blocks and a plurality of second outer sliding blocks, and the first outer sliding blocks and the second outer sliding blocks are spaced apart from each other and sequentially connected.

17. The electronic device according to claim 16, wherein two end portions of each of the first outer sliding blocks along a long edge are respectively provided with two protrusions protruding outward along a short edge, each of the protrusions protrudes from an adjacent one of the second outer sliding blocks, and each of the outer shafts penetrates the protrusion and the adjacent one of the second outer sliding blocks.

18. The electronic device according to claim 16, wherein a long edge side of each of the first outer sliding blocks is provided with an arc-shaped groove, a long edge side of each of the second outer sliding block is provided with an arc-shaped protruded portion, and the arc-shaped protruded portion of one of the second outer sliding blocks is correspondingly accommodated in the arc-shaped groove of an adjacent one of the first outer sliding blocks.

19. The electronic device according to claim 16, wherein the inner sliding blocks comprise a plurality of first inner sliding blocks and a plurality of second inner sliding blocks, the first inner sliding blocks and the second inner sliding blocks are spaced apart from each other and sequentially connected, the first inner sliding blocks are disposed corresponding to the first outer sliding blocks, and the second inner sliding blocks are disposed corresponding to the second outer sliding blocks.

20. The electronic device according to claim 19, wherein each of the first outer sliding blocks and each of the second outer sliding blocks are provided with a groove respectively, and the first inner sliding blocks and the second inner sliding blocks are slidably disposed in the grooves.

* * * * *